US006472951B1

(12) United States Patent
Fiedziuszko et al.

(10) Patent No.: US 6,472,951 B1
(45) Date of Patent: Oct. 29, 2002

(54) MICROWAVE MULTIPLEXER WITH MANIFOLD SPACING ADJUSTMENT

(75) Inventors: S. Jerry Fiedziuszko, Palo Alto; Stephen C. Holme, San Ramon; Norman L. O'Neal, Menlo Park, all of CA (US)

(73) Assignee: Space Systems/Loral, Inc., Palo Alto, CA (US)

( * ) Notice: Subject to any disclaimer, the term of this patent is extended or adjusted under 35 U.S.C. 154(b) by 0 days.

(21) Appl. No.: 09/477,881

(22) Filed: Jan. 5, 2000

(51) Int. Cl.[7] .......................... H03H 7/46; H03H 7/38; H04J 1/08; H01P 1/213; H01P 3/123

(52) U.S. Cl. ........................ 333/126; 333/135; 333/33; 333/239; 333/253; 333/209

(58) Field of Search ................................ 333/126, 135, 333/33, 231, 239, 202, 208, 209, 253, 248, 99 R, 233, 232

(56) References Cited

U.S. PATENT DOCUMENTS 6,191,664 B1 * 2/2001 Fiedziuszko et al. ....... 333/126

* cited by examiner

*Primary Examiner*—Robert Pascal
*Assistant Examiner*—Kimberly E Glenn
(74) *Attorney, Agent, or Firm*—Perman & Green, LLP

(57) ABSTRACT

A series of tuning brackets are mounted on the microwave waveguide manifold at positions between the input waveguide/filter couplings. These brackets constrain the manifold and are constructed with adjustment screws extending through the brackets and mechanically connected to the manifold. The movement of the adjustment screw will tend to deform the manifold dimensions resulting in a fine adjustment of the wavelength (λ) of the multiplexer.

7 Claims, 4 Drawing Sheets

MICROWAVE MULTIPLEXER WITH MANIFOLD SPACING ADJUSTMENT

BACKGROUND OF THE INVENTION

It is now prevalent in satellite microwave communications systems for such systems to process multiple channels. This requires the combination or separation of the channels either for transmission or for processing after acquisition. This function is usually accomplished by means of a multiplexer.

The typical multiplexer consists of a series of input waveguides generally including filter elements connected to a waveguide manifold through ports or iris'Each of the filters is tuned and the iris' designed for maximum efficiency of the overall system. The connections of the input waveguides to the manifolds must be accurately positioned according to strict spacing requirements governed by the wavelength (λ) of the transmitted microwave energy. The spacing is measured along the longitudinal axis of the manifold from the shorted end.

The spacing requirements are often difficult to meet because of manufacturing tolerances. Prior art systems, however, provide no means by which spacing inaccuracies can be adjusted after the parts of the multiplexer are constructed and assembled. It is a purpose of this invention to provide a means to adjust the manifold spacing.

In order to obtain optimum performance of the multiplexer, while minimizing losses, the internal impedance of the various components must be closely matched. This process of tuning the system requires the balancing of hundreds of variables many of which are extremely sensitive because of the high frequency environment. The design of these components has, therefore, become a difficult technological challenge.

Although the optimization problem can be diminished through the use of various design techniques, precise construction of the components is made difficult, if not impossible by the inherent limitations of manufacturing tolerances. The design of the these components, therefore, ultimately relies on a trial and error process in which multiplexers are constructed, tested, modified, retested and gradually optimized. There are limits however, to the number of iterations which can be employed with constructive results.

It is therefore desirable to provide additional methods of tuning a manifold. It is therefore a purpose of this invention to provide a method of simulating manifold spacing adjustment by deforming the manifold dimensions to change the wavelength and assist in the tuning of the overall system.

SUMMARY OF THE INVENTION

The manifold of this invention is constructed with a primary manifold section to which the input wave guides, including filters, are connected. One end of the manifold is shorted and the other is open to form an output port. The filter couplings are spaced along the longitudinal axis of the manifold a predetermined distance from the shorted end of the manifold. A series of tuning brackets are mounted on the manifold at positions between the input waveguide/filter couplings. These brackets constrain the manifold and are constructed with adjustment screws extending through the brackets and mechanically connected to the manifold. The screws engage the bracket by means of threads to enable the screw to be adjusted in and out of the bracket. The movement of the adjustment screw will tend to deform the manifold dimensions resulting in a fine adjustment of the guide wavelength (λ) of the multiplexer. In affect this change in the microwave characteristics of the manifold acts as a spatial adjustment of the position of the input wave guides.

DESCRIPTION OF THE DRAWING

The invention is described in more detail below with reference to the attached drawing in which.

DESCRIPTION OF THE PREFERRED EMBODIMENT

The system of this invention is constructed for use in a satellite communications network in which multiple channels are required. In the process of receiving and transmitting microwave signals, either at a ground station or on board an orbiting satellite, it is necessary to combine or separate the communication channels before further processing. This task is accomplished by means of a multiplexer. For illustration purposes an output multiplexer 1 is described with particular reference to FIG. 1. In this particular application the channeled output of the multiplexer 1 is fed to an antenna for transmission to a ground station.

Figure 1:
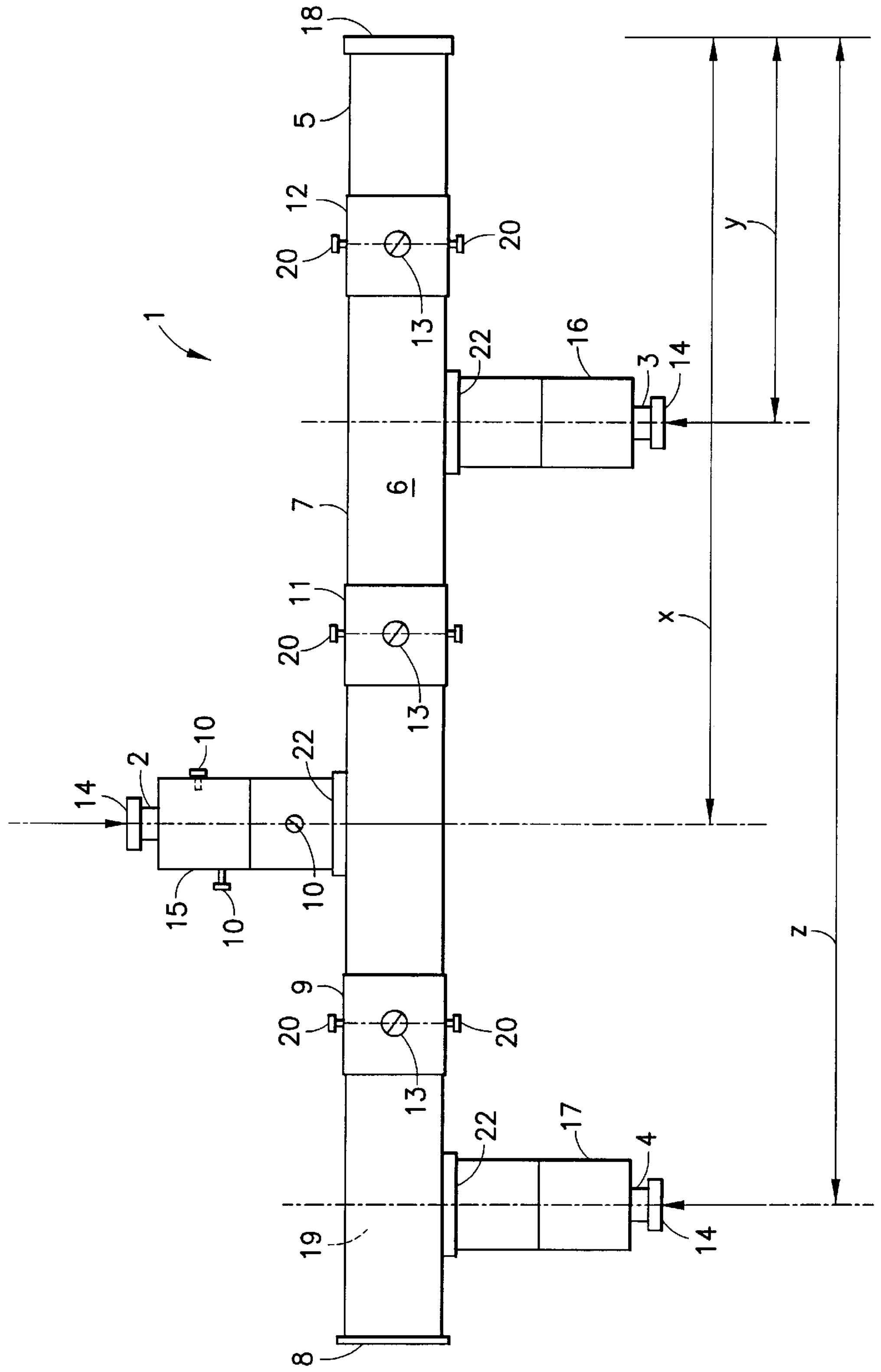
FIG. 1 is a schematic diagram of the multiplexer of this invention.
Figure 2:
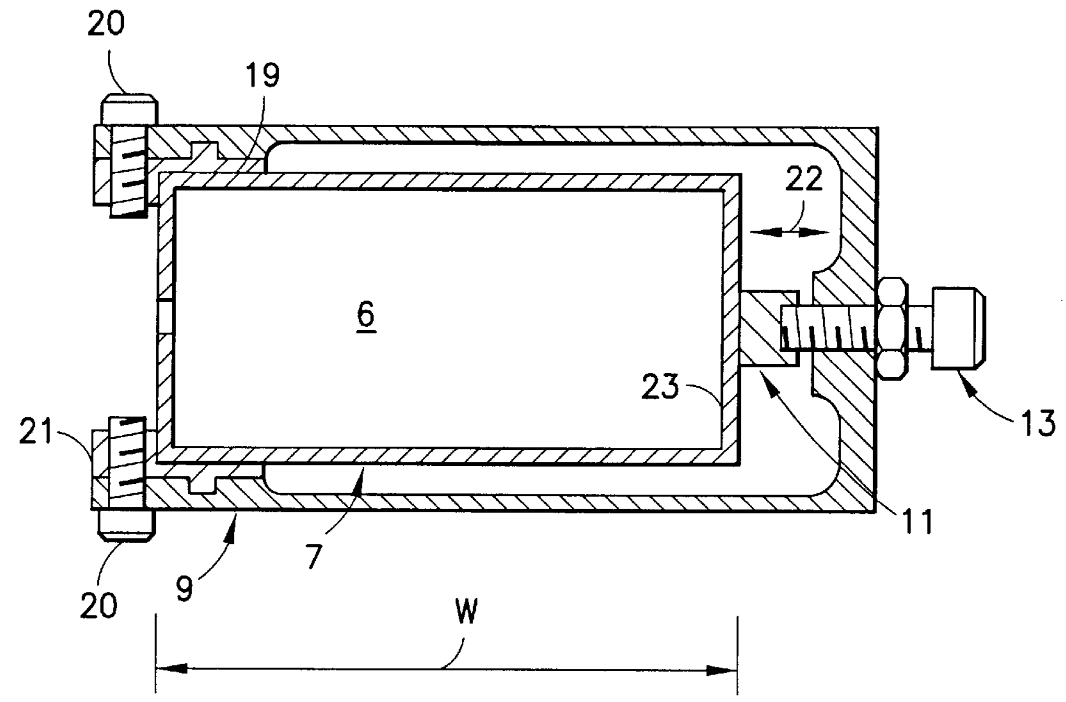
FIG. 2 is a cross sectional view of the tuning bracket of this invention.
Figure 3:
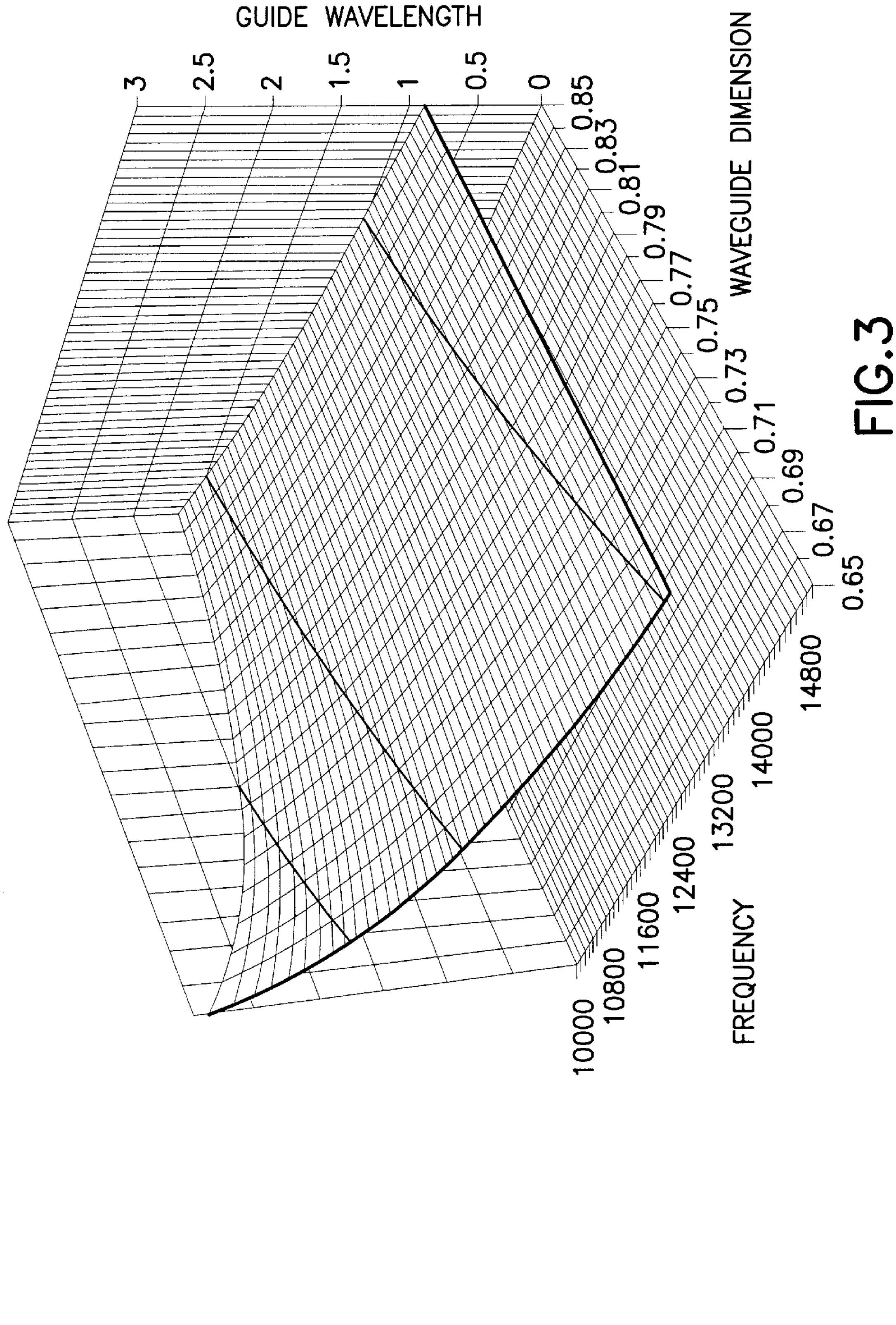
FIG. 3 is a graph showing the relationship of waveguide wavelength (λ) with waveguide dimensions and frequency.

Since it is intended for use onboard a satellite, the system must be accurately tuned because there is no opportunity for further correction after it is in orbit. The multiplexer 1 is an assembly of several waveguides 2–4 with waveguide cavity filters 15–17 which are coupled to the manifold 5, as shown in FIG. 1. Each of the input waveguides 2–4 receive microwave signals through an input port 14 and are coupled to the manifold 5 by an appropriate coupling mechanism 22, as is known in the art. The waveguides 2–4 will generally be coupled through filters 15, 16 and 17. The filters may be provided with tuning screws 10 as used in the prior art.

The manifold 5 is constructed having a primary section 7 enclosing a waveguide 6. The primary section has shorting cap 18 at one end and an output 8 at the other end. The primary section 7 may be constructed of an appropriate lightweight, high strength material having the necessary conductivity characteristics such as silver plated carbon reinforced composite or a temperature stable alloy such as is sold under the trademark INVAR. In addition the waveguide can be constructed from the walled aluminum sheet. In general the manifold is constructed with a rectangular cross section having a broad wall 24 at the top, side walls 25, and a bottom wall 26.

The input waveguides 2–4 are positioned along the longitudinal dimension of the manifold at distances x,y, and z respectively from the short 18. The wavelength of the waveguide is chosen from the middle of the waveguide band. The general practice is to start by spacing the input waveguides at distances of half wavelengths and then adjust in plus or minus increments. It follows that the distances from the short 18 will be multiples of half wavelengths at least at the start. According to this invention a method and apparatus are provided which effectively adjusts the dimensions X, Y, and Z electrically by small changes in the width (w) of the waveguide.

In accordance with this invention, a series of tuning brackets 9, 11, and 12 are mounted on waveguide 7 at predetermined locations, between each of the input waveguides 2–4 and between the waveguide 3 and the short 18. In order to obtain maximum effectiveness of the adjustment the brackets are placed midway between the incoming waveguides as shown in FIG. 1. Brackets 9,11, 12 are restrained from movement on the waveguide by means of angle members 19 and 21 held in place by screws 20. An adjustment screw 13 extends through the bracket and is operatively connected to manifold 7 through a pad 11 fixed to manifold 7. The screw may be operated to apply a deformation force 22, either in compression or tension, to the short side 23 of the manifold 7. This serves to adjust the width (w) at the manifold in small increments on the order of 0.001 inches.

The overall system 1 of this invention is tuned to optimize the performance of the multiplexer while minimizing losses. The design is performed taking into consideration the many variables in accordance with the trial and error practices currently in use. In order to tune the multiplexer of the subject invention, the adjustment screw 13 is moved in and out by applying an appropriate torque. This will deform the manifold width (w) sufficiently to change the characteristic wavelength of the manifold. Since the spacing of the input components of the multiplexer 1 is dependent on the wavelength, this adjustment by deformation has the effect of adjusting the spacing between the input components. This adjustment allows a fine tuning of the multiplexer 1 beyond currently available design methods.

Figure 4:
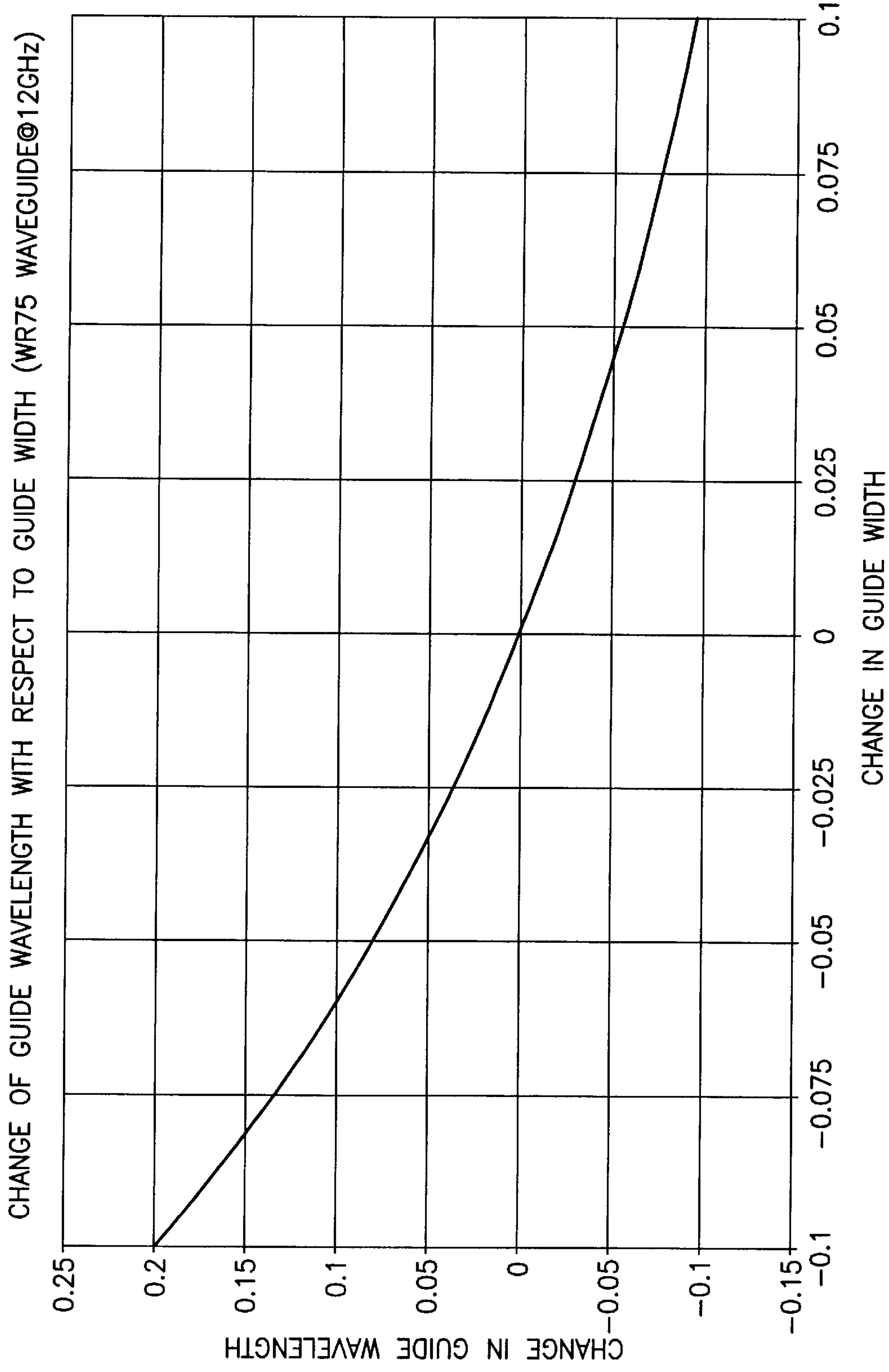
FIG. 4 is a graph showing the relationship between changes in waveguide wavelength relative to adjustments in waveguide width.

As shown in FIG. 4, the adjustment of the width of the manifold will change the on/off frequency of the waveguide $\lambda_C$ which is equal to 2w. The waveguide ($\lambda_Y$) will change in accordance with the formula $\lambda_Y=\lambda_O/(1-\lambda O^2/\lambda_O^2)^{1/2}$. In this manner a simple and reliable mechanism is provided to tune the multiplexer of the assembly.

We claim:

1. Apparatus to simulate an adjustment of the position of at least one connecting port along the length of a manifold of a microwave waveguide multiplexer, said manifold including an elongated primary section to which is connected at least one waveguide through said at least one connecting port, a shorted end and an output port, said apparatus comprising:

a tuning bracket mounted on an exterior wall of the primary section of the manifold at a position along the longitudinal axis of the manifold between said shorted end and said connecting port, said bracket formed to surround at least a portion of said exterior wall; and an adjustment mechanism mounted on said tuning bracket for operative connection to said exterior wall, said adjustment mechanism mounted and connected to exert an adjustable force on said wall to change a dimension of the manifold.

2. Apparatus to simulate an adjustment of the position of at least one connecting port along the length of a manifold of a microwave waveguide multiplexer, said manifold including an elongated primary section to which is connected at least one waveguide through said at least one connecting port, a shorted end and an output port, said apparatus as described in claim 1, wherein a plurality of waveguides are connected through individual connecting ports at predetermined positions along the length of the manifold and said tuning bracket is positioned adjacent to each of the at least one connecting ports.

3. Apparatus to simulate an adjustment of the position of at least one connecting port along the length of a manifold of a microwave waveguide multiplexer, said manifold including an elongated primary section to which is connected at least one waveguide through said at least one connecting port, a shorted end and an output port, said apparatus as described in claim 2, wherein said tuning brackets are positioned midway between said shorted end and said connecting port or midway between the immediately adjacent connecting port.

4. Apparatus to simulate an adjustment of the position of at least one connecting port along the length of a manifold of a microwave waveguide multiplexer, said manifold including an elongated primary section to which is connected at least one waveguide through said at least one connecting port, a shorted end and an output port, said apparatus as described in claim 1, wherein said adjustment mechanism comprises a screw.

5. A method to simulate an adjustment of the position of at least one connecting port along the length of a manifold of a microwave waveguide multiplexer, said manifold including an elongated primary section to which is connected at least one waveguide through said at least one connecting port, a shorted end and an output port, said method comprising the steps of:

mounting a tuning bracket on an exterior wall of the primary section of the manifold at a position along the longitudinal axis of the manifold between said shorted end and said connecting port, said bracket formed to surround at least a portion of said exterior wall;

operatively connecting said tuning bracket to said exterior wall, through an adjustment mechanism mounted to exert an adjustable force on said wall;

deforming a wall of the manifold by operation of said adjustment mechanism sufficiently to adjust the characteristic wavelength of the multiplexer.

6. A method to simulate an adjustment of the position of at least one connecting port along the length of a manifold of a microwave waveguide multiplexer, said manifold including an elongated primary section to which is connected at least one waveguide through said at least one connecting port, a shorted end and an output port, said method, as described in claim 5, wherein the adjustment mechanism comprises a screw and the step of deforming a wall of the manifold comprises the steps of rotating the screw towards or away from said manifold.

7. A method to simulate an adjustment of the position of at least one connecting port along the length of a manifold of a microwave waveguide multiplexer, said manifold including an elongated primary section to which is connected at least one waveguide through said at least one connecting port, a shorted end and an output port, said method, as described in claim 6, wherein the tuning bracket is positioned adjacent to a connecting port midway between said port and said shorted end or an immediately adjacent connecting port.

* * * * *